United States Patent
Kim et al.

(10) Patent No.: US 9,412,673 B2
(45) Date of Patent: Aug. 9, 2016

(54) MULTI-MODEL METROLOGY

(71) Applicant: KLA-Tencor Corporation, Milpitas, CA (US)

(72) Inventors: In-Kyo Kim, San Jose, CA (US); Xin Li, Shanghai (CN); Leonid Poslavsky, Belmont, CA (US); Liequan Lee, Fremont, CA (US); Meng Cao, Union City, CA (US); Sungchul Yoo, San Jose, CA (US); Andrei V. Shchegrov, Los Gatos, CA (US); Sangbong Park, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/459,516

(22) Filed: Aug. 14, 2014

(65) Prior Publication Data

US 2015/0058813 A1  Feb. 26, 2015

Related U.S. Application Data

(60) Provisional application No. 61/869,434, filed on Aug. 23, 2013.

(51) Int. Cl.
| | |
|---|---|
| *G06F 17/50* | (2006.01) |
| *H01L 21/66* | (2006.01) |
| *G03F 7/20* | (2006.01) |

(52) U.S. Cl.
CPC ............ *H01L 22/20* (2013.01); *G03F 7/70616* (2013.01); *H01L 22/12* (2013.01)

(58) Field of Classification Search
USPC .......................................................... 716/51
See application file for complete search history.

(56) References Cited

U.S. PATENT DOCUMENTS

2006/0064280 A1  3/2006  Vuong et al.
2009/0024967 A1  1/2009  Su et al.
2012/0022836 A1* 1/2012  Ferns et al. ........................ 703/2
2012/0123748 A1  5/2012  Aben et al.

FOREIGN PATENT DOCUMENTS

JP  2011027461 A  2/2011

OTHER PUBLICATIONS

Vaid, Alok et al., "A Holistic Metrology Approach: Hybrid Metrology Utilizing Scatterometry, CD-AFM and CD-SEM", Proc. of SPIE, vol. 7971, 797103, Retrieved from the Internet: <http://proceedings.spiedigitallibrary.org/>, Accessed on Aug. 7, 2014, 2011, pp. 797103-1-797103-20.
Vaid, Alok et al., "Implementation of Hybrid Metrology at HVM Fab for 20nm and beyond", Proc. of SPIE, vol. 8681, 868103, Retrieved from the Internet: <http://spiedigitallibrary.org/>, Accessed on Aug. 7, 2014, 2013, pp. 868103-1-868103-15.
"International Application Serial No. PCT/US2014/052142, Search Report and Written Opinion mailed Dec. 2, 2014", 9 pgs.

* cited by examiner

*Primary Examiner* — Eric Lee
(74) *Attorney, Agent, or Firm* — Kwan & Olynick LLP

(57) ABSTRACT

Disclosed are apparatus and methods for characterizing a plurality of structures of interest on a semiconductor wafer. A plurality of models having varying combinations of floating and fixed critical parameters and corresponding simulated spectra is generated. Each model is generated to determine one or more critical parameters for unknown structures based on spectra collected from such unknown structures. It is determined which one of the models best correlates with each critical parameter based on reference data that includes a plurality of known values for each of a plurality of critical parameters and corresponding known spectra. For spectra obtained from an unknown structure using a metrology tool, different ones of the models are selected and used to determine different ones of the critical parameters of the unknown structure based on determining which one of the models best correlates with each critical parameter based on the reference data.

25 Claims, 10 Drawing Sheets

MULTI-MODEL METROLOGY

CROSS-REFERENCE TO RELATED APPLICATIONS

This application claims the benefit of prior application U.S. Provisional Application No. 61/869,434, filed 23 Aug. 2013 by In-kyo Kim et al., which application is herein incorporated by reference in its entirety for all purposes.

TECHNICAL FIELD OF THE INVENTION

The present invention relates generally to methods and systems for characterization of semiconductor wafers and, more specifically, to model-based metrology.

BACKGROUND

Photolithography or optical lithography systems used in the manufacture of integrated circuits have been around for some time. Such systems have proven extremely effective in the precise manufacturing and formation of very small details in the product. In some photolithography systems, a circuit image is written on a substrate by transferring a pattern via a light or radiation beam (e.g., UV or ultraviolet light). For example, the lithography system may include a light or radiation source that projects a circuit image through a reticle and onto a silicon wafer coated with a material sensitive to irradiation, e.g., photoresist. The exposed photoresist typically forms a pattern that after development masks the layers of the wafer during subsequent processing steps, as for example deposition and/or etching.

Due to the large scale of circuit integration and the decreasing size of semiconductor devices, the reticles and fabricated devices have become increasingly sensitive to critical dimension (CD) variations, as well as other critical parameter variations such as film thickness and composition, etc. These variations, if uncorrected, can cause the final device to fail to meet the desired performance due to electrical timing errors. Even worse, these errors can cause final devices to malfunction and adversely affect yield.

In one metrology technique, critical dimension is measured by scanning electron microscope CD-SEM images at each location on the wafer and examining each image for pattern quality. This technique is time consuming (e.g., several hours). Other techniques have their own disadvantages.

In view of the foregoing, improved metrology apparatus and techniques for determining critical parameters are needed.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of characterizing a plurality of structures of interest on a semiconductor wafer is disclosed. A plurality of models having varying combinations of floating and fixed critical parameters and corresponding simulated spectra is generated. Each model is generated to determine one or more critical parameters for unknown structures based on spectra collected from such unknown structures. It is determined which one of the models best correlates with each critical parameter based on reference data that includes a plurality of known values for each of a plurality of critical parameters and corresponding known spectra. For spectra obtained from an unknown structure using a metrology tool, different ones of the models are selected and used to determine different ones of the critical parameters of the unknown structure based on determining which one of the models best correlates with each critical parameter based on the reference data.

In a specific implementation, the models have different sets of one or more critical parameters that are fixed and different sets of one or more critical parameters that are floating. In another aspect, each of the models has a low degree of freedom and is configured to provide a different subset of the critical parameters of the unknown structure. In yet another aspect, at least one of the models is configured to utilize a same geometric model with a plurality of different constraint conditions that correspond to a plurality of sub-models or utilize different geometric models that correspond to a plurality of sub-models. In another example, at least a first one of the models is configured to send a selected critical parameter to a second one of the models using a transform function. In a specific implementation, the spectra from the known structure and the unknown structure is acquired using one or more of the following: spectroscopic ellipsometry, Mueller matrix spectroscopic ellipsometry, spectroscopic reflectometry, spectroscopic scatterometry, beam profile reflectometry, beam profile ellipsometry, a single wavelength, a single discrete wavelength range, or multiple discrete wavelength ranges. In another specific example, the models are generated using a rigorous wave coupling analysis technique.

In one embodiment, the critical parameters include a middle critical dimension (MCD), top CD (TCD), bottom CD (BCD), profile height (HT), side wall angle (SWA) and material properties. In another aspect, different models have higher correlations for different one or more of the critical parameters than other models, and different models are selected and used based on which models have a highest correlation for each critical parameter. In another aspect, selecting and using different models includes selecting between a plurality of sub-models of a first model based on execution of the first model meeting a condition, and each sub-model is configured for determining a same set of critical parameters. In another aspect, each sub-model has different sets of fixed and floating critical parameters and the first model is initially executed with all its critical parameters floating. In an alternative embodiment, selecting and using different models includes selecting between a plurality of sub-models of a first model and the first model based on execution of the first model meeting a condition, and each sub-model is configured for determining a different subset of a base set of critical parameters and the first model is configured for determining the base set of critical parameters. In another implementation, selecting and using different models is further based on an expected critical dimension range. In another aspect, different models are also selected and used for different subsystems of the metrology tool.

In an alternative embodiment, the invention pertains to a system for inspecting or measuring a specimen. This system comprises an illuminator for generating illumination and illumination optics for directing the illumination towards an unknown structure. The system also includes collection optics for directing a plurality of spectra signals in response to the illumination from the unknown structure to a sensor of the system. The system further includes a processor and memory configured for performing any of the above described operations.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Figure 1:
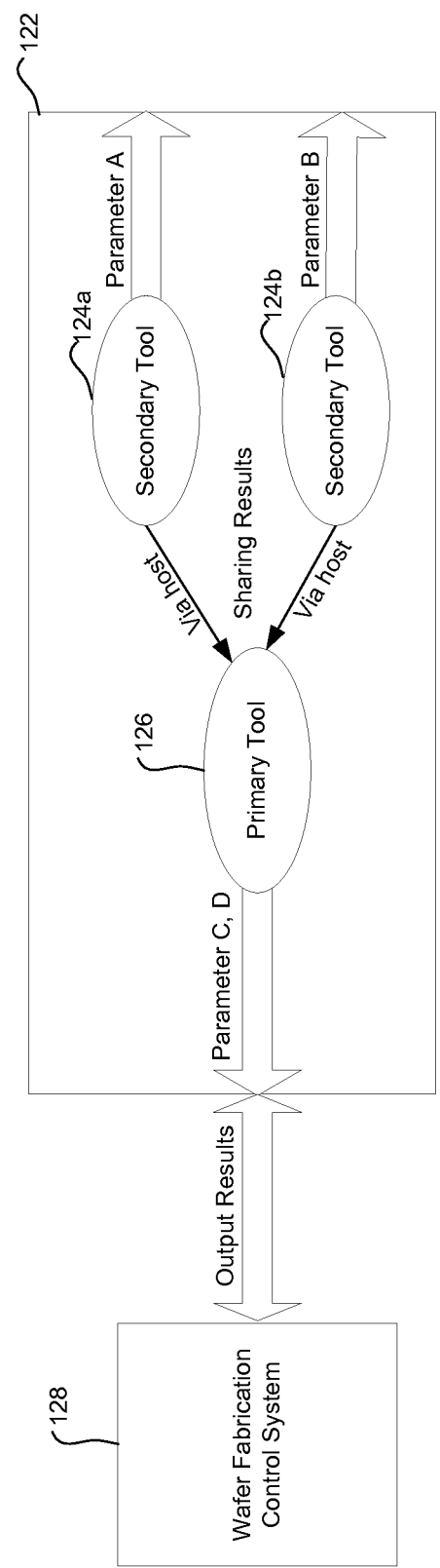
FIG. 1 is a diagrammatic illustration of a hybrid multi-tool metrology system.

FIG. 1 is a diagrammatic illustration of a hybrid multi-tool metrology system 122. As shown the hybrid system 122 may utilize a primary tool 126 to combine results from multiple tools, e.g., 124a and 124b, to improve the measurements of one or more critical parameters via wafer fabrication control system 128, including the photolithography process tool. By way of examples, the various metrology tools can include any of the following tools: CD-SEM (critical dimension scanning electron microscopy), CD-TEM (CD transmission electron microscopy), CD-AFM (CD atomic force microscopy), and/or SCD (scatterometry critical dimension). Each type of tool may have associated strengths and weaknesses. For instance, CD-SEM, CD-TEM, and CD-AFM are destructive and time-consuming.

Figure 2:
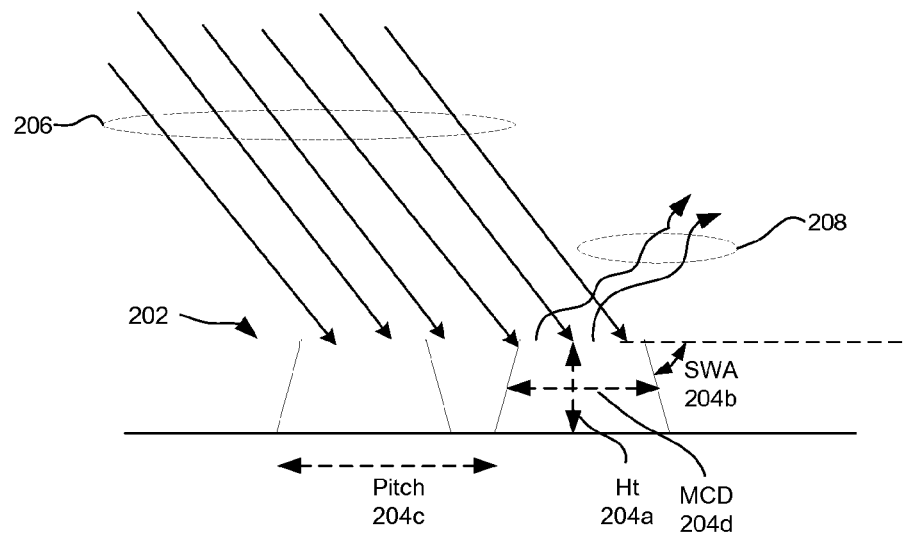
FIG. 2 is a diagrammatic representation of a model that simulates a spectral response for a representative semiconductor structure having one or more feature characteristics.

SCD is a non-destructive metrology technique that is based on optical scatterometry signals or spectra measurements from various semiconductor targets on a product or test wafer. In some implementations, a model is implemented to simulate expected spectra results from various target structures. FIG. 2 is a diagrammatic representation of a model that simulates a spectral response for a representative semiconductor structure 202 having one or more feature characteristics. For example, the modeled target structure 202 may have a profile height (HT) 204a, sidewall angle (SWA) 204b, pitch 204c, middle critical dimension (MCD) 204d, material composition, etc. The model simulates incident light 206 that is directed by a particular tool towards the structure and scattered light 208 from such structure.

Figure 3A:
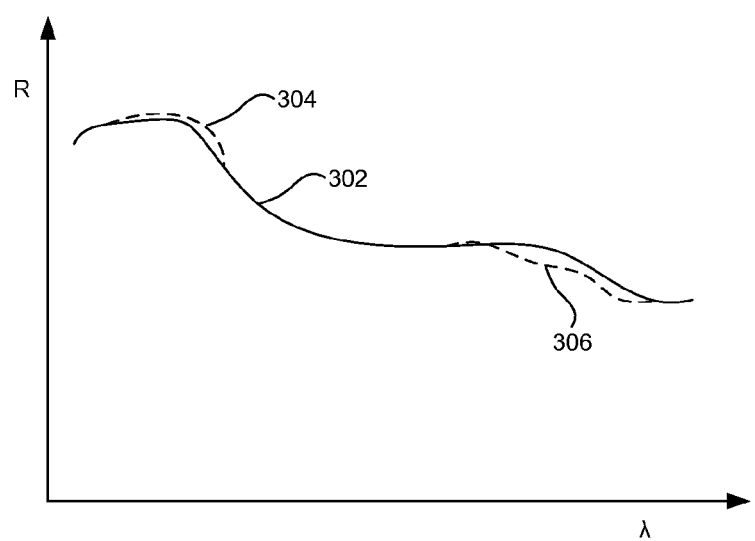
FIG. 3A is a graph of an example model's spectra results as a function of wavelength for uncorrelated varying feature parameters.

A model typically simulates results from structures having various parameter configurations. FIG. 3A is a graph of an example model's spectra results as a function of wavelength for uncorrelated varying feature parameters. For instance, spectra results 302 result from an initial set of values for top CD (TCD) and bottom CD (BCD). Spectra portion 304 results from a change in TCD, while spectra portion 306 results from a change in BCD. The parameters TCD and BCD are uncorrelated in this example and the results from changing these parameters are easily distinguishable from each other.

Figure 3B:
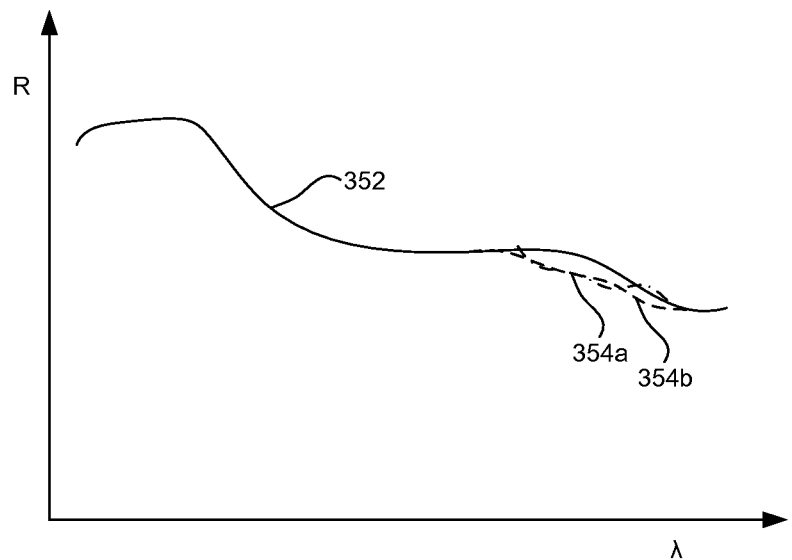
FIG. 3B is a graph of a second example model's spectra results as a function of wavelength for correlated varying feature parameters.

However, an SCD model typically has correlations between parameters, and the accuracy of CD can be adversely affected by such correlations. FIG. 3B is a graph of a second example model's spectra results as a function of wavelength for correlated varying feature parameters. Spectra results 352 correspond to a particular set of TCD and BCD values. In this model, the spectra changes corresponding to TCD and BCD (e.g., 354a and 354b) are difficult to distinguish from each other and are highly correlated.

Parameter correlations can be broken by fixing one or more parameters. If there are many critical parameters, each critical parameter can have a best accuracy with different parameters being fixed. One method, referred to herein as a "Pass strategy", provides only one fixing condition to obtain a more accurate value on a specific critical CD.

Example Multiple Model Embodiments:

Certain embodiments of the present invention expand the pass strategy by using multiple models for multiple critical parameter measurement accuracy. The different models will generally fix different sets of one or more parameters, while varying one or more other parameters. Each model can be configured to determine one or more parameter values that result in a best match between the model-determined spectra and spectra that is measured from an unknown target structure. Different models can be selected to obtain optimum accuracy for determined parameter results under different conditions. Parameter values that are output by such set of differently configured models will tend to correlate well with reference data, which includes known feature parameter values for reference structures.

Different models can generally have different degrees of freedom with respect to varying/floating or fixing specific model critical parameters. Some models may have a high DOF (e.g., 10 or 15 DOF) and can report many different CPs, but not easily determine all CPs accurately since there is likely to be high correlation between parameters. Another model may have low DOF and cannot report many CPs, but can provide accurate solutions for a subset of CPs. A low DOF model may show better parameter in-wafer variation due to its low parameter correlation. Finally, multiple low DOF models can be utilized to obtain better solutions for many CPs, while providing improved monitoring of in-wafer variation.

Figure 4:
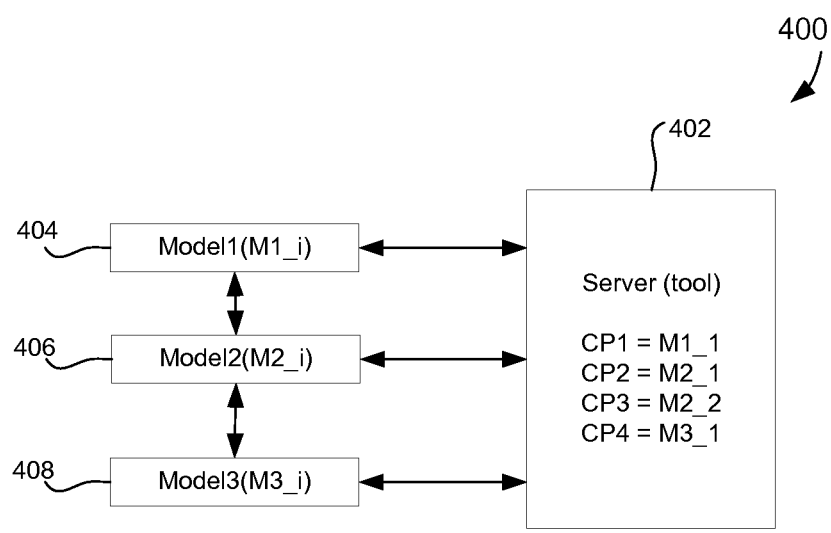
FIG. 4 is a diagrammatic representation of a multiple model system in accordance with one embodiment of the present invention.

FIG. 4 is a diagrammatic representation of a multiple model system 400 in accordance with one embodiment of the present invention. As shown, the system may utilize any number and type of models, such as model1 404, model2 406, and model3 408. Each model can include a same geometric model with one or more different constraint conditions or different geometric models. For instance, model1 404 may include sub-model1_1 through sub-model1_i.

Figure 5:
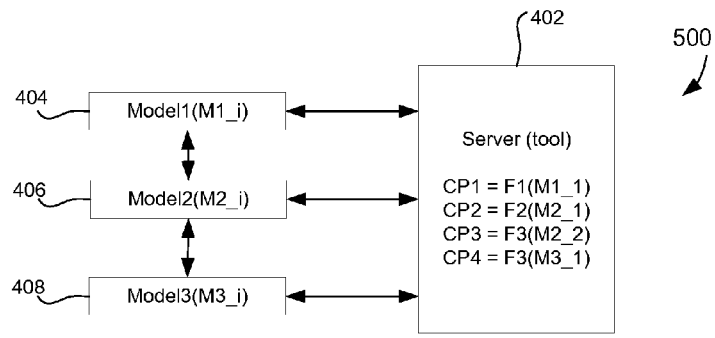
FIG. 5 is a diagrammatic representation of a multiple model system in accordance with an alternative implementation of the present invention.

A particular server or metrology tool 402 may selectively utilize these models for different types of critical parameter measurements. That is, different models and/or sub-models will provide output that correlates better to different critical parameter measurements. For example, critical parameter CP1 is more accurately determined by Model1_1; CP2 and CP3 are more accurately determined with sub-model2_1 and model 2_2, respectively; and CP4 is more accurately reported by model3_1. Data may optionally be transferred between models. For example, SWA, not necessarily a CP, determined from Model 1 could be transferred to Model2 for the purpose of the better accuracy in MCD (CP2) and HT (CP3) by breaking correlation in Model2. In an alternative embodiment, one or more CPs may be fed from one model to another so as to obtain better CP results. FIG. 5 is a diagrammatic representation of a multiple model system 500 in accordance with an alternative implementation of the present invention. This implementation provides the flexibility of providing an arbitrary transfer function ƒ for feeding one or more parameters from one model to another. (e.g., M2_3=a*M1_3+b), In this case, M1_3 from Model1 is fed to M2_3 in model 2 by a simple linear transfer function. In similar, the function F(M) can be an arbitrary transform function for feeding a particular parameter from one model to the final result in a server. In the illustrated example, CP3 is obtained by a combination of outputs transferred from model2 with the transfer function F2, and CP4 is obtained from a combination of outputs from model3 with different transfer function F3.

Figure 6:
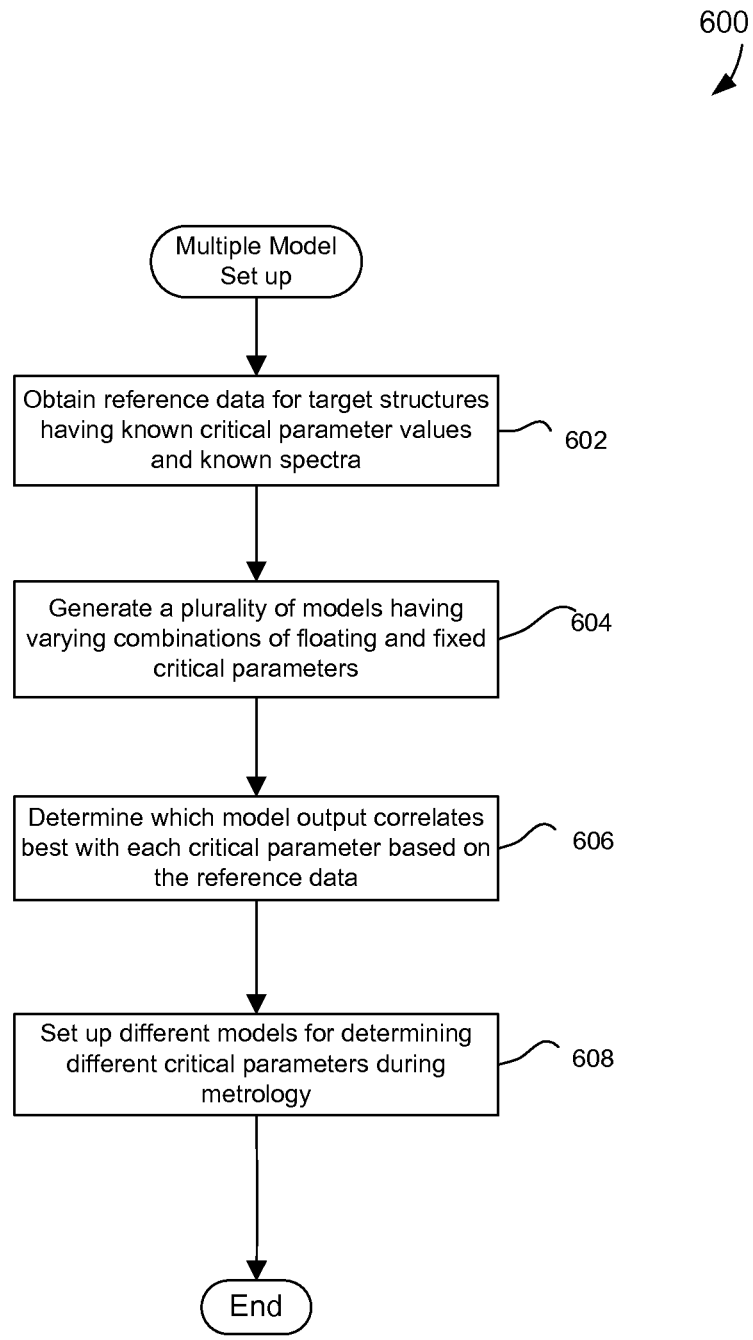
FIG. 6 is a flow chart illustrating a multi-model setup process for determining a set of models for determining critical parameters in accordance with one embodiment of the present invention.

FIG. 6 is a flow chart illustrating a multi-model setup process 600 for determining a set of models for determining critical parameters in accordance with one embodiment of the present invention. Initially, reference data for targets structures having known critical parameter values and known spectra are obtained in operation 602. For instance, the reference data may have been obtained by a metrology optical tool collecting spectra from targets having varying profiles, e.g., different MCD and SWA, etc. In a specific example, varying critical parameter values for different targets are obtained by varying process conditions across a design of experiment (DOE) wafer. To determine dimensional parameters (such as profile characteristics (bottom or top CD, sidewall angle, etc.) for the reference or training targets, these targets may be characterized by any suitable reference metrology, e.g. cross-section TEM, atomic force microscopy (AFM), or CD~SEM. The reference data may then be provided in the form of spectra and matching critical parameter values.

The spectra acquired from various targets may include any suitable metrology signal that can be correlated with one or more critical parameters. Example spectra signals include, but are not limited to, any type of scatterometry, spectroscopic, ellipsometry, and/or reflectometry signals, including: $\Psi$, $\Delta$, Rs (complex reflectivity of the s polarization), Rp (complex reflectivity of the p polarization), Rs ($|r_s|^2$), Rp ($|r_p|^2$), R (unpolarized reflectivity), $\alpha$ (spectroscopic "alpha" signal), $\beta$ (spectroscopic "beta" signal), and functions of these parameters, such as tan($\Psi$), cos($\Delta$), ((Rs−Rp)/(Rs+Rp)), Mueller matrix elements ($M_{ij}$), etc. The signals could alternatively or additionally be measured as a function of incidence angle, polarization, azimuthal angle, angular distribution, phase, or wavelength or a combination of more than one of these parameters. The signals could also be a characterization of a combination of signals, such as an average value of a plurality of any of the above described ellipsometry and/or reflectometry signal types. Other embodiments may use monochromatic or laser light sources where at least one of the signals may be obtained at a single wavelength, instead of multiple wavelengths. The illumination wavelengths could be any range, starting from X-ray wavelengths and going to far infra-red wavelengths. The type of acquired signals may be selected based on signal sensitivity to the structure of interest. For instance, certain wavelengths may be more sensitive to certain particular structure dimensions.

Referring back to FIG. 6, a plurality of models may then be generated in operation 604. These models have varying combinations of floating and fixed critical parameters. Each model will generally represent complex profile shapes formed from different materials, but a same underlying structure. The model also simulates the scattering and output spectra with respect to each different floating parameter change, as well as fixed parameters. Example model generation techniques can include an EM (electro-magnetic) solver and use such algorithms as RCWA (rigorous coupled wave analysis), FEM (finite element method), method of moments, surface integral method, volume integral method, FDTD (finite difference time domain), etc. One example RCWA software is AcuShape available from KLA-Tencor of Milpitas, Calif.

Figure 7A:
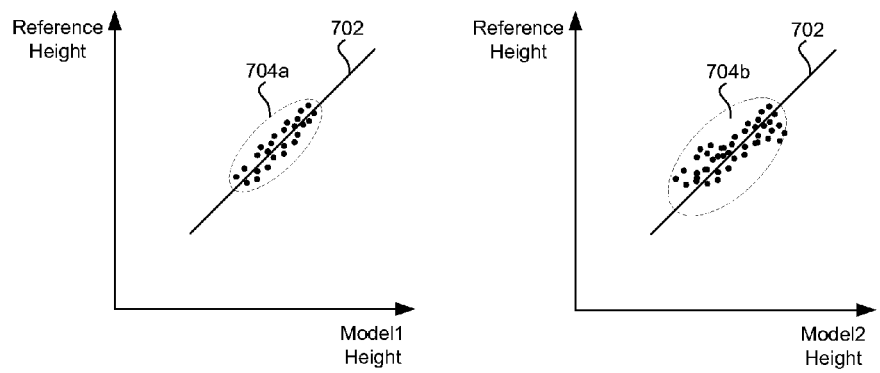
FIG. 7A illustrates two different models' correlation for height with respect to reference data.
Figure 7B:
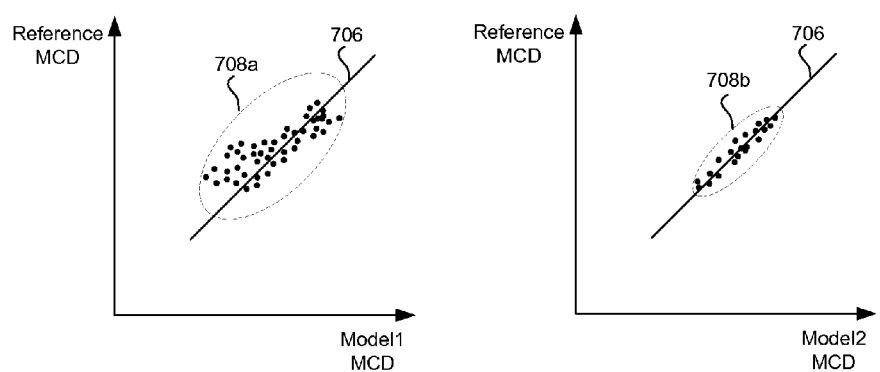
FIG. 7B illustrates two different models' correlation for MCD with respect to reference data.

It may then be determined which model output correlates best with each critical parameter based on the reference data in operation 606. For instance, it may be determined which model output correlates best with each critical parameter with respect to the reference data. More specifically, the reference data will include different spectra for varying values of a particular parameter, such as height. The optimum model outputs spectra for such particular parameter values (height) that best correlate to the reference spectra for such particular parameter values (height). This process is repeated for each particular parameter type, e.g., MCD, TCD, BCD, etc. In one example, a first model will correlate better for height than a second model, while the second model correlates better for MCD than the first model. FIG. 7A illustrates two different models' correlation for height with respect to reference data. Line 702 represents perfect correlation between reference height and model height. In the current example, model1's height correlation 704a with reference height is better than model2's correlation 704b. Similarly, FIG. 7B illustrates two different models' correlation for MCD with respect to reference data. As shown, model2's MCD correlation 708b with reference MCD is better than model1's correlation (708a).

Based on these different correlations, different models may then be set up for determining different critical parameters during metrology in operation 608. In the current example, the first model is selected for determining height, while the second model is selected for determining MCD. The multiple model setup procedure 600 may then end. Of course, setup procedure 600 may be executed again, for example, when a process changes.

Each model may include any suitable type and number of parameters. Example parameters include MCD, TCD, BCD, HT and SWA for the resist structure, composition of layer, layer roughness, etc. One or more parameters may float or have varying values, while other parameter may remain fixed. For instance, MCD may be set to a particular value or be set to equal the floating parameter TCD value+an offset value e.g., MCD=TCD+2.

Figure 8:
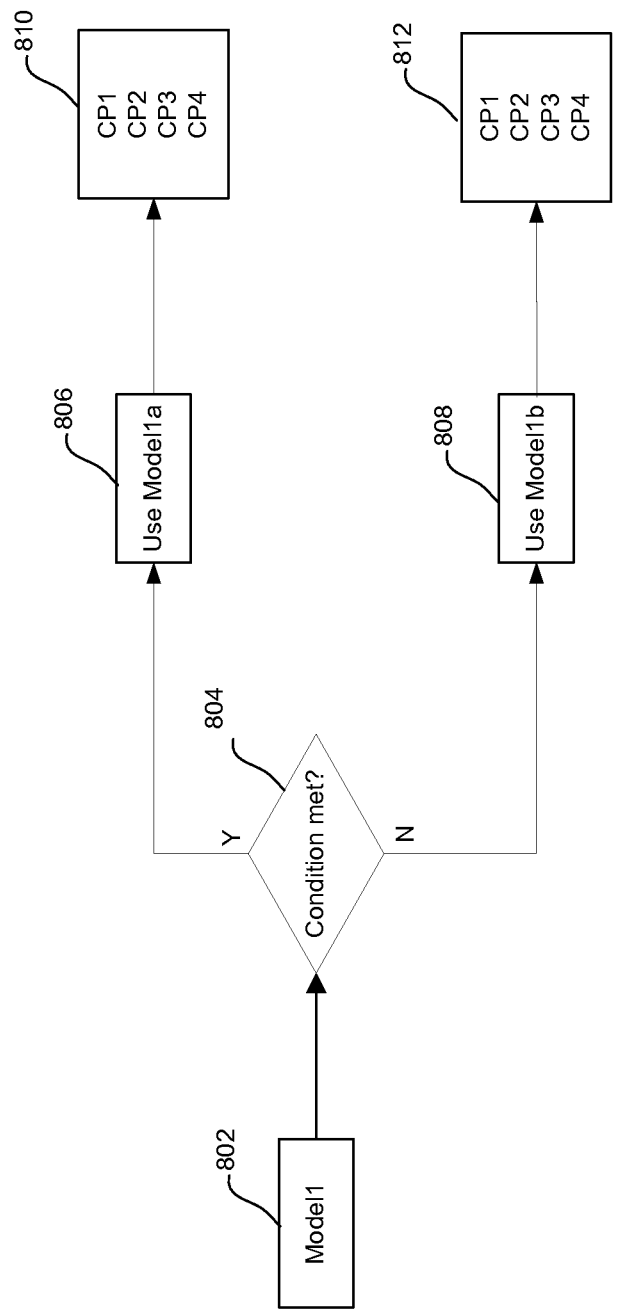
FIG. 8 is an example metrology flow for selecting a sub-model based on a condition in accordance with a specific implementation of the present embodiment.

In another embodiment, one or more conditions may be set up during metrology for model selection. FIG. 8 is an example metrology flow for selecting a sub-model based on a condition in accordance with a specific implementation of the present embodiment. Initially, a first model1 802 may be selected and executed for determining one or more critical parameters. In the illustrated example, model1 802 has two sub-models for determining critical parameters CP1, CP2, CP3, and CP4 (e.g., 810 and 812). The different sub-models (e.g., model1a and model1b) may include different combinations of fixed and floating parameters, including floating parameters CP1~CP4.

It may then be determined whether a condition has been met in operation 804. Any suitable condition may be used to determine which model is best as described further below. If the condition has been met, a sub-model1a may be used in operation 806 to determine parameters CP1~CP4. Otherwise, sub-model1b may be used in operation 808 to determine such parameters.

Figure 9:
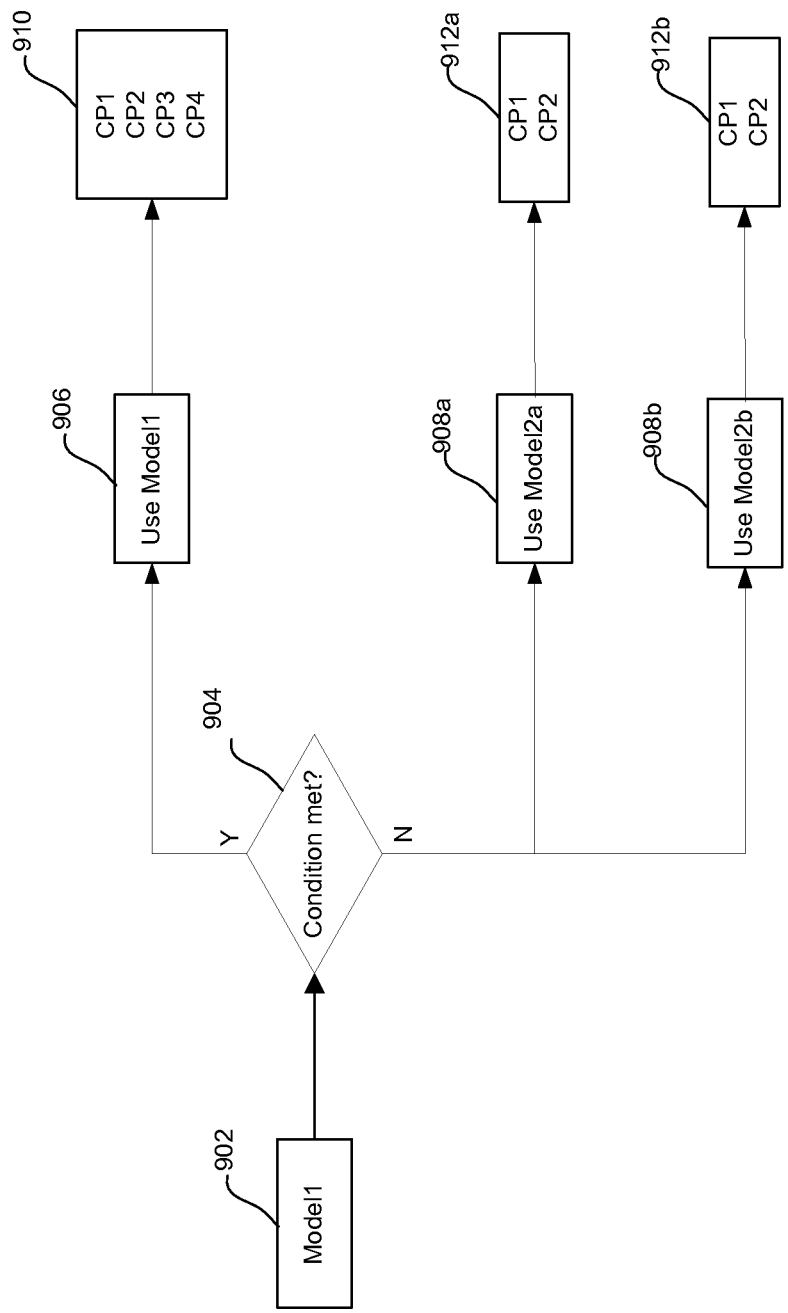
FIG. 9 is a second example metrology flow for selecting a single model or a multi-model based on a condition in accordance with another embodiment of the present embodiment.

FIG. 9 is a second example metrology flow for selecting a single model or a multi-model based on a condition in accordance with another embodiment of the present embodiment. In this example, model1 is selected and executed for determining parameters CP1~CP4. It is then determined whether a condition is met in operation 904. If the condition is met, the selected model1 may be used in operation 906 to determine critical parameters CP1~CP4 results 910. Otherwise, sub-model2a may be used in operation 908a and sub-model2b used in operation 908b to determine a first set of the parameters CP1 and CP2 (912a) and a second set of parameters CP3 and CP4 (912b), respectively.

Figure 10:
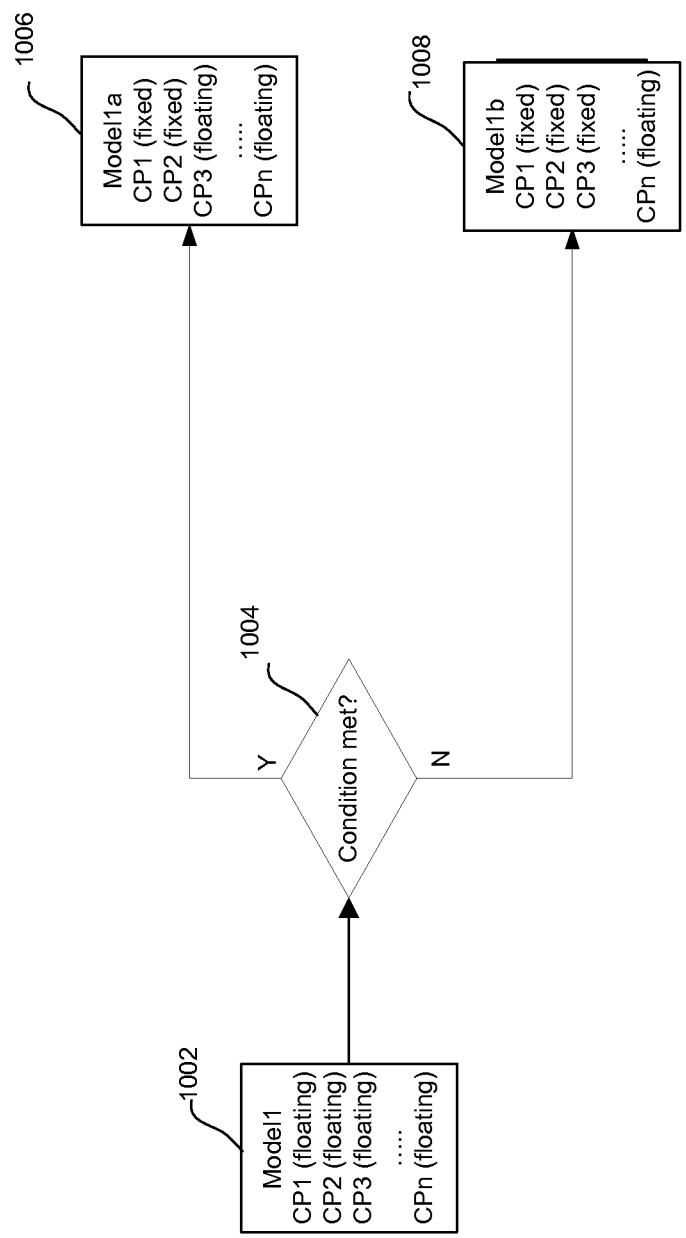
FIG. 10 is a third example metrology flow for selecting a sub-model based on a condition in accordance with another embodiment of the present embodiment.

FIG. 10 is a third example metrology flow for selecting a sub-model based on a condition in accordance with another embodiment of the present embodiment. In this example, model1 may initially be executed with all its parameters floating in operation 1002. It may then be determined whether a particular condition is met in operation 1004. If the condition is met, then a first sub-model1a is used with parameters CP1 and CP2 being fixed in operation 1006. Otherwise, sub-model1b is used with parameters CP1, CP2, and CP3 being fixed in operation 1008.

Any suitable number and type of conditions may be used to determine which model or sub-model to select for the above processes. In one example, a condition may be a fitting quality threshold being reached. For instance, a model's spectra output may be required to fit the real spectra within a predetermined amount of fitness as a condition. Various goodness-of-fit statistics may be used. Examples include sum of squares due to error (SSE), R-square, adjusted R-square, root mean squared error (RMSE), normalized GOF (NGOF), etc. A residual analysis or set of confidence and prediction bounds may alternatively or additionally be used to evaluate a goodness-of-fit quality condition.

In another condition example, it may be determined whether a particular CP of a model is within a predetermined range. For instance, a particular model may be generated for larger CD values, while a second model is generated for a smaller range of CD values.

Different models can be used for different metrology tool subsystems. That is, different metrology modules may have a different associated model or sub-model. For instance, an SE 0 and 90 degree azimuth subsystem may use a first model; an SE and eUVR subsystem may use a second model; and a SE and BPR subsystem may use a third model. Each model can have its own state mechanism for setting and controlling its state, thus, allowing multiple types of operations (different sub-models) within a single model. In general, each model may be a multi-model having a plurality of sub-models for determining different sets of CPs or using different algorithms to determine the same set of CPs. For instance, a model may utilize a recursive multi-model structure.

Certain embodiments of the present invention include apparatus and methods for determining critical parameters of structures of interest on a semiconductor wafer by the use of multiple models, which are associated with improved CP measurements. A conventional model may provide improvements for a particular CP, but have degradation of other CPs. Using multiple models allow improvement to all CPs. These techniques allow a more accurate means of measuring CP variation across an entire wafer based on analyzing the spectra signals using differently configured models. In certain embodiments, these techniques are applicable to determine CP of lines, trenches, resist or directed self-assembly (DSA) structures, film, periodic and aperiodic structures, etc.

Figure 11:
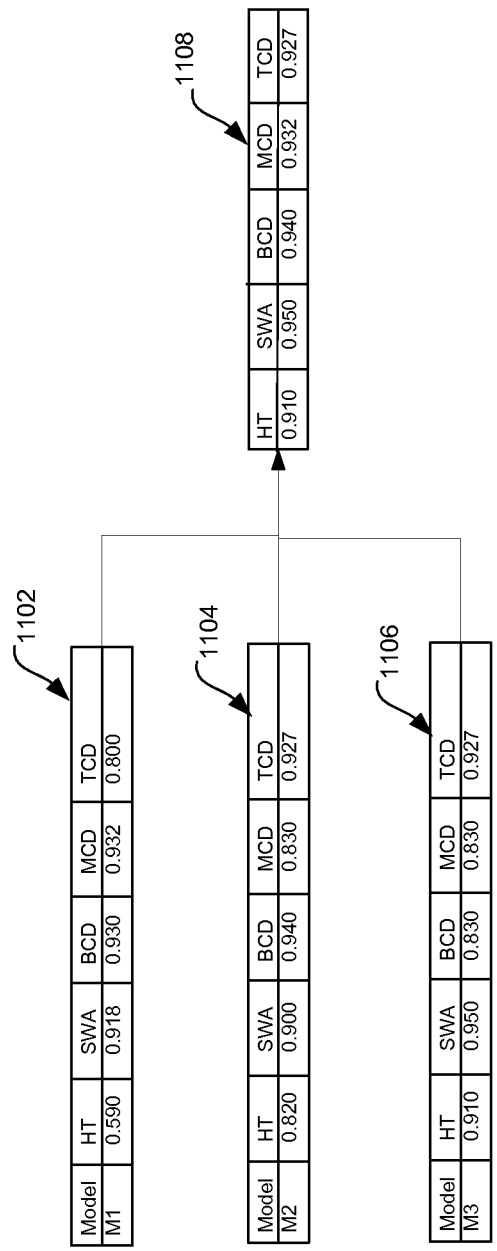
FIG. 11 illustrates improved critical parameter correlation by use of multiple models in accordance with one embodiment of the present invention.

FIG. 11 illustrates improved critical parameter correlation by use of multiple models in accordance with one embodiment of the present invention. Correlation between model results for height (HT), SWA, BCD, MCD, and TCD and reference data is shown for three different models M1, M2, and M3. Table 1102 shows the correlation for model M1. Table 1104 shows correlation for model M2. Table 1106 shows correlation for model M3. Different models result in different levels of correlation for different CPs. For instance, model M1 has the highest correlation for MCD, while model M2 has the highest correlation for BCD. The best results from all of the models may be reported. As shown, table 1108 reports the best correlated results for each CP from the different models. Thus, the reported CP results are together more highly correlated to the reference data than the individual models M1~M3.

Any suitable combination of hardware and/or software may be used to implement any of the above described techniques. In a general example, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology tools can generally be used to measure various radiation signals pertaining to structural and material characteristics (e.g., material composition, dimensional characteristics of structures and films such as film thickness and/or critical dimensions of structures, overlay, etc.) associated with various semiconductor fabrication processes. These measurements can be used to facilitate process controls and/or yield efficiencies in the manufacture of semiconductor dies.

The metrology tool can comprise one or more hardware configurations which may be used in conjunction with certain embodiments of this invention. Examples of such hardware configurations include, but are not limited to, the following: Spectroscopic ellipsometer (SE), SE with multiple angles of illumination, SE measuring Mueller matrix elements (e.g. using rotating compensator(s)), single-wavelength ellipsometers, beam profile ellipsometer (angle-resolved ellipsometer), beam profile reflectometer (angle-resolved reflectometer), broadband reflective spectrometer (spectroscopic reflectometer), single-wavelength reflectometer, angle-resolved reflectometer, imaging system, and scatterometer (e.g. speckle analyzer)

Figure 12:
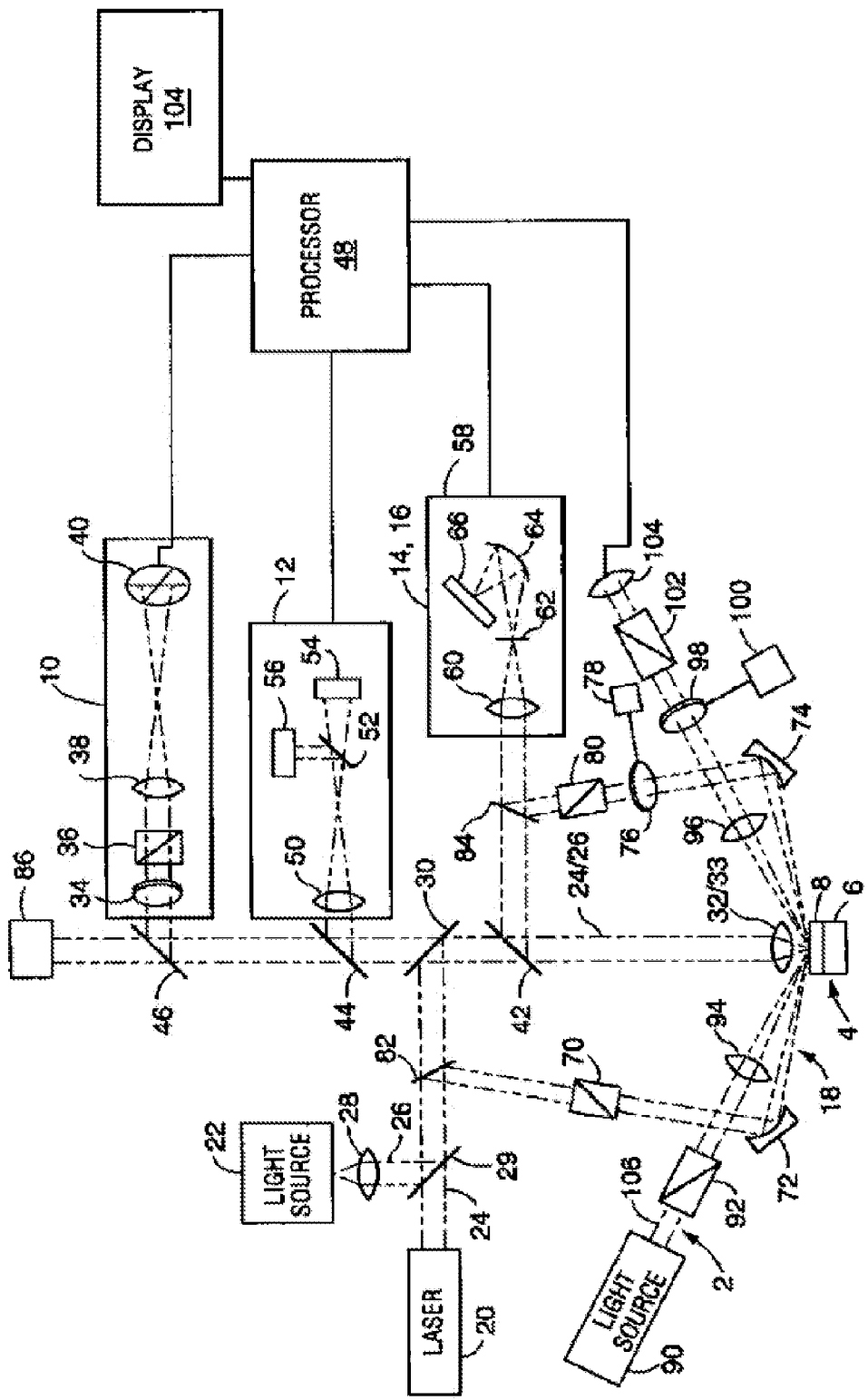
FIG. 12 illustrates an example metrology system in accordance with one embodiment of the present invention.

The hardware configurations can be separated into discrete operational systems. On the other hand, one or more hardware configurations can be combined into a single tool. One example of such a combination of multiple hardware configurations into a single tool is further illustrated and described U.S. Pat. No. 7,933,026, which patent is herein incorporated by reference in its entirety for all purposes. FIG. 12 shows, for example, a schematic of an exemplary metrology tool that comprises: a) a broadband SE (e.g., 18); b) an SE (e.g., 2) with rotating compensator (e.g., 98); c) a beam profile ellipsometer (e.g., 10); d) a beam profile reflectometer (e.g., 12); e) a broadband reflective spectrometer (e.g., 14); and f) a deep ultra-violet reflective spectrometer (e.g., 16). In addition, there are typically numerous optical elements (e.g., 92, 72, 94, 70, 96, 74, 76, 80, 78, 98, 100, 102, 104, 32/33, 42, 84, 60, 62, 64, 66, 30, 82, 29, 28, 44, 50, 52, 54, 56, 46, 34, 36, 38, 40, and 86) in such systems, including certain lenses, collimators, mirrors, quarter-wave plates, polarizers, detectors, cameras, apertures, and/or light sources. The wavelengths for the optical systems can vary from about 120 nm to 3 microns. The azimuth angle for the optical systems can also vary. For non-ellipsometer systems, signals collected can be polarization-resolved or unpolarized.

FIG. 12 provides an illustration of multiple metrology heads integrated on the same tool. However, in many cases, multiple metrology tools are used for measurements on a single or multiple metrology targets. Several embodiments of multiple tool metrology are further described, e.g., in U.S. Pat. No. 7,478,019 by Zangooie et al, entitled "Multiple tool and structure analysis", which patent is incorporated herein by reference in its entirety for all purposes.

The illumination system of certain hardware configurations may include one or more light sources. The one or more light sources may generate light having only one wavelength (e.g., monochromatic light), light having a number of discrete wavelengths (e.g., polychromatic light), light having multiple wavelengths (e.g., broadband light), and/or light that sweeps through wavelengths, either continuously or hopping between wavelengths (e.g., tunable sources or swept sources). Examples of suitable light sources are: a white light source, an ultraviolet (UV) laser, an arc lamp or an electrodeless lamp, a laser sustained plasma (LSP) source, for example, those commercially available from Energetiq Technology, Inc. of Woburn, Mass., a supercontinuum source (such as a broadband laser source) such as those commercially available from NKT Photonics Inc. of Morganville, N.J., or shorter-wavelength sources such as x-ray sources, extreme UV sources, or some combination thereof. The light source(s) may also be configured to provide light having sufficient brightness, which in some cases may be a brightness greater than about 1 W/(nm cm2 Sr). The metrology system may also include a fast feedback to the light source for stabilizing its power and wavelength. Output of the light source can be delivered via free-space propagation, or in some cases delivered via optical fiber or light guide of any type.

In turn, one or more detectors or spectrometers are configured to receive via a collection optical elements illumination reflected or otherwise scattered from the surface of the specimen 4. Suitable sensors include charged coupled devices (CCD), CCD arrays, time delay integration (TDI) sensors, TDI sensor arrays, photomultiplier tubes (PMT), and other sensors. Measured spectra or detected signal data (as a function of position, wavelength, polarization, azimuth angle, etc.) may be passed from each detector to the processor system 48 for analysis.

It should be recognized that the various steps described throughout the present disclosure may be carried out by a single processor system 48 or, alternatively, a multiple processor system 48. Moreover, different subsystems of the system of FIG. 12, such as the spectroscopic ellipsometer, may include a computer system suitable for carrying out at least a portion of the steps described herein. Therefore, the aforementioned description should not be interpreted as a limitation on the present invention but merely an illustration. Further, the one or more processor system 48 may be configured to perform any other step(s) of any of the method embodiments described herein.

In addition, the processor system 48 may be communicatively coupled to a detector system in any manner known in the art. For example, the one or more processor system 48 may be coupled to computing systems associated with the detector system. In another example, the detector system may be controlled directly by a single computer system coupled to processor system 48.

The processor system 48 of the metrology system may be configured to receive and/or acquire data or information from the subsystems of the system by a transmission medium that may include wireline and/or wireless portions. In this manner, the transmission medium may serve as a data link between the processor system 48 and other subsystems of the system of FIG. 12.

Processor system 48 of the integrated metrology system may be configured to receive and/or acquire data or information (e.g., measurement spectra, difference signals, statistical results, reference or calibration data, training data, models, extracted features or transformation results, transformed datasets, curve fittings, qualitative and quantitative results, etc.) from other systems by a transmission medium that may include wireline and/or wireless portions. In this manner, the transmission medium may serve as a data link between the processor system 48 and other systems (e.g., memory on-board metrology system, external memory, reference measurement source, or other external systems). For example, processor system 48 may be configured to receive measurement data from a storage medium (e.g., internal or external memory) via a data link. For instance, spectral results obtained using the detection system may be stored in a permanent or semipermanent memory device (e.g., internal or external memory). In this regard, the spectral results may be imported from on-board memory or from an external memory system. Moreover, the processor system 48 may send data to other systems via a transmission medium. For instance, qualitative and/or quantitative results determined by processor system 48 may be communicated and stored in an external memory. In this regard, measurement results may be exported to another system.

Processor system 48 may include, but is not limited to, a personal computer system, mainframe computer system, workstation, image computer, parallel processor, or any other device known in the art. In general, the term "processor system" may be broadly defined to encompass any device having one or more processors, which execute instructions from a memory medium. Program instructions implementing methods such as those described herein may be transmitted over a transmission medium such as a wire, cable, or wireless transmission link. Program instructions may be stored in a computer readable medium (e.g., memory). Exemplary computer-readable media include read-only memory, a random access memory, a magnetic or optical disk, or a magnetic tape.

The metrology tool may be designed to make many different types of measurements related to semiconductor manufacturing. Certain embodiments of the invention for determining quality and/or quantitative values may utilize such measurements. In certain embodiments, the tool may measure spectra and determine characteristics of one or more targets, such as quality and defect quantity values, critical dimensions, overlay, sidewall angles, film thicknesses, process-related parameters (e.g., focus and/or dose). The targets can include certain regions of interest that are periodic in nature, such as for example gratings in a memory die. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools as described in U.S. Pat. No. 7,478,019. The data from such measurements may be combined. Data from the metrology tool may be used in the semiconductor manufacturing process, for example, to feed-forward, feed-backward and/or feed-sideways corrections to the process (e.g. lithography, etch) and therefore, might yield a complete process control solution.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is one of them and described in the patent by Piwonka-Corle et al. (U.S. Pat. No. 5,608,526, "Focused beam spectroscopic ellipsometry method and system"). Apodizers can be used to mitigate the effects of optical diffraction causing the spread of the illumination spot beyond the size defined by geometric optics. The use of apodizers is described in the patent by Norton, U.S. Pat. No. 5,859,424, "Apodizing filter system useful for reducing spot size in optical measurements and other applications." The use of high-numerical-aperture tools with simultaneous multiple angle-of-incidence illumination is another way to achieve small-target capability. This technique is described, e.g. in the patent by Opsal et al, U.S. Pat. No. 6,429,943, "Critical dimension analysis with simultaneous multiple angle of incidence measurements."

Other measurement examples may include measuring the composition of one or more layers of the semiconductor stack, measuring certain defects on (or within) the wafer, and measuring the amount of photolithographic radiation exposed to the wafer. In some cases, metrology tool and algorithm may be configured for measuring non-periodic targets, see e.g. "The Finite Element Method for Full Wave Electromagnetic Simulations in CD Metrology Using Scatterometry" by P. Jiang et al (U.S. 61/830,536) or "Method of electromagnetic modeling of finite structures and finite illumination for metrology and inspection" by A. Kuznetsov et al. (U.S. 61/761,146).

Measurement of parameters of interest can also involve a number of algorithms. For example, optical interaction of the incident beam with the sample can be modeled using EM (electro-magnetic) solver and uses such algorithms as RCWA, FEM, method of moments, surface integral method, volume integral method, FDTD, and others. The target of interest can usually be modeled (parameterized) using a geometric engine, or in some cases, process modeling engine or a combination of both. The use of process modeling is described in "Method for integrated use of model-based metrology and a process model," by A. Kuznetsov et al. (U.S. 61/738,760). A geometric engine may be implemented, for example, in AcuShape software product of KLA-Tencor of Milpitas, Calif.

Collected data can be analyzed by a number of data fitting and optimization techniques an technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others.

Collected data can also be analyzed by algorithms that do not include modeling, optimization and/or fitting e.g. provisional patent application 61/745,981, which is incorporated herein by reference, and as described herein.

Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA, programmable optics components, etc.

The data analysis and fitting steps may be used to pursue one of the following goals: measurement of quality, defect number, CD, SWA, shape, stress, composition, films, bandgap, electrical properties, focus/dose, overlay, generating process parameters (e.g., resist state, partial pressure, temperature, focusing model), and/or any combination thereof; modeling and/or design of metrology systems; and modeling, design, and/or optimization of metrology targets.

Certain embodiments of the present invention presented here generally address the field of semiconductor metrology and process control, and are not limited to the hardware, algorithm/software implementations and architectures, and use cases summarized above.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method of characterizing a plurality of structures of interest on a semiconductor wafer, the method comprising:
generating a plurality of models that are different from each other in that they have different combinations of floating and fixed critical parameters for outputting simulated spectra, wherein the plurality of models are generated as final models to determine different one or more critical parameters for unknown structures based on spectra collected from such unknown structures;

after generating the models and without generating another model, determining which one of the models best correlates with each critical parameter based on reference data that includes a plurality of known values for each of a plurality of critical parameters and corresponding known spectra, for spectra measured from an unknown structure using a metrology tool, selecting and using different ones of the models to determine different ones of the critical parameters of the unknown structure based on determining which one of the models best correlates with each critical parameter based on the reference data; and reporting the different ones of the determined critical parameters on a display of the metrology tool.

2. The method of claim 1, wherein the models have different sets of one or more critical parameters that are fixed and different sets of one or more critical parameters that are floating.

3. The method of claim 1, wherein each of the models has a low degree of freedom and is configured to provide a different subset of the critical parameters of the unknown structure.

4. The method of claim 1, wherein at least one of the models is configured to utilize a same geometric model with a plurality of different constraint conditions that correspond to a plurality of sub-models or utilize different geometric models that correspond to a plurality of sub-models.

5. The method of claim 1, wherein at least a first one of the models is configured to send a selected critical parameter to a second one of the models using a transform function.

6. The method of claim 1, wherein the spectra from the known structure and the unknown structure, is acquired using one or more of the following: spectroscopic ellipsometry, Mueller matrix spectroscopic ellipsometry, spectroscopic reflectometry, spectroscopic scatterometry, beam profile reflectometry, beam profile ellipsometry, a single wavelength, a single discrete wavelength range, or multiple discrete wavelength ranges.

7. The method of claim 1, wherein each of the models is generated using a rigorous wave coupling analysis technique.

8. The method of claim 1, wherein the critical parameters include a middle critical dimension (MCD), top CD (TCD), bottom CD (BCD), height (HT) and side wall angle (SWA).

9. The method of claim 1, wherein a first one of the models is selected and used to determine a first one of the critical parameters and a second one of the models is selected and used to determine a second one of the critical parameters, wherein the first model has a higher correlation for determining the first critical parameter than the second model, and wherein the second model has a higher correlation for determining the second critical parameter than the first model.

10. The method of claim 1, wherein selecting and using different models includes selecting between a plurality of sub-models of a first model based on execution of the first model meeting a condition, wherein each sub-model is configured for determining a same set of critical parameters.

11. The method of claim 1, wherein each sub-model has different sets of fixed and floating critical parameters and the first model is initially executed with all its critical parameters floating.

12. The method of claim 1, wherein selecting and using different models includes selecting between a plurality of sub-models of a first model and the first model based on execution of the first model meeting a condition, wherein each sub-model is configured for determining a different subset of a base set of critical parameters and the first model is configured for determining the base set of critical parameters.

13. The method of claim 1, wherein selecting and using different models is further based on an expected critical dimension range.

14. The method of claim 1, wherein different models are also selected and used for different subsystems of the metrology tool.

15. A semiconductor metrology tool, comprising:
an illuminator for generating illumination;
illumination optics for directing the illumination towards an unknown structure;
collection optics for directing a plurality of spectra from the unknown structure to a sensor;
the sensor for acquiring the plurality of spectra signals from the unknown structure; and
a processor and memory configured for performing the following operations:
generating a plurality of models that are different from each other in that they have different combinations of floating and fixed critical parameters for outputting simulated spectra, wherein the plurality of models are generated as final models to determine different one or more critical parameters for unknown structures based on spectra collected from such unknown structures;
after generating the models and without generating another model, determining which one of the models best correlates with each critical parameter based on reference data that includes a plurality of known values for each of a plurality of critical parameters and corresponding known spectra, and
for spectra obtained from an unknown structure selecting and using different ones of the models to determine different ones of the critical parameters of the unknown structure based on determining which one of the models best correlates with each critical parameter based on the reference data.

16. The metrology tool of claim 15, wherein at least one of the models is configured to utilize a same geometric model with a plurality of different constraint conditions that correspond to a plurality of sub-models or utilize different geometric models that correspond to a plurality of sub-models.

17. The metrology tool of claim 15, wherein at least a first one of the models is configured to send a selected critical parameter to a second one of the models using a transform function.

18. The metrology tool of claim 15, wherein the spectra from the known structure and the unknown structure is acquired using one or more of the following: spectroscopic ellipsometry, Mueller matrix spectroscopic ellipsometry, spectroscopic reflectometry, spectroscopic scatterometry, beam profile reflectometry, beam profile ellipsometry, a single wavelength, a single discrete wavelength range, or multiple discrete wavelength ranges.

19. The metrology tool of claim 15, wherein the critical parameters include a middle critical dimension (MCD), top CD (TCD), bottom CD (BCD), and side wall angle (SWA).

20. The metrology tool of claim 15, wherein a first one of the models is selected and used to determine a first one of the critical parameters and a second one of the models is selected and used to determine a second one of the critical parameters, wherein the first model has a higher correlation for determining the first critical parameter than the second model, and wherein the second model has a higher correlation for determining the second critical parameter than the first model.

21. The metrology tool of claim 15, wherein selecting and using different models includes selecting between a plurality of sub-models of a first model based on execution of the first model meeting a condition, wherein each sub-model is configured for determining a same set of critical parameters.

22. The metrology tool of claim 15, wherein each sub-model has different sets of fixed and floating critical parameters and the first model is initially executed with all its critical parameters floating.

23. The metrology tool of claim 15, wherein selecting and using different models includes selecting between a plurality of sub-models of a first model and the first model based on execution of the first model meeting a condition, wherein each sub-model is configured for determining a different subset of a base set of critical parameters and the first model is configured for determining the base set of critical parameters.

24. The metrology tool of claim 15, wherein selecting and using different models is further based on an expected critical dimension range.

25. The metrology tool of claim 15, wherein different models are also selected and used for different subsystems of the metrology tool.

\* \* \* \* \*